United States Patent [19]

Bobeck

[11] 4,314,358

[45] Feb. 2, 1982

[54] SEGMENTED, CONDUCTOR ACCESS, MAGNETIC BUBBLE MEMORY

[75] Inventor: Andrew H. Bobeck, Chatham, N.J.

[73] Assignee: Bell Telephone Laboratories, Incorporated, Murray Hill, N.J.

[21] Appl. No.: 105,617

[22] Filed: Dec. 20, 1979

[51] Int. Cl.³ .............................................. G11C 19/08
[52] U.S. Cl. ........................................ 365/19; 365/15
[58] Field of Search .................. 365/15, 16, 19, 20, 365/21

[56] References Cited

U.S. PATENT DOCUMENTS 3,916,397 10/1975 Takahashi ............................ 365/15
4,075,708 2/1978 Chen ................................... 365/15
4,162,537 7/1979 Bobeck ............................... 365/19

OTHER PUBLICATIONS

Marceldekker, Inc.—"Magnetic-Bubble Memory Technology" by Hsu Chang 1978, pp. 98–99.

Primary Examiner—James W. Moffitt
Attorney, Agent, or Firm—Herbert M. Shapiro

[57] ABSTRACT

A conductor-access, magnetic bubble memory organized in the major-minor mode has minor loops separated into minor loop segments. The segments can be powered for moving bubbles selectively only within the corresponding segments of the minor loops. A transfer operation moves bubbles between minor loop segments permitting bubble movement to the major loop. The ability to move bubbles only in a selected set of corresponding segments of the loops at a time permits operation with highly attractive power requirements.

5 Claims, 6 Drawing Figures

SEGMENTED, CONDUCTOR ACCESS, MAGNETIC BUBBLE MEMORY

FIELD OF THE INVENTION

This invention relates to magnetic bubble memories, and more particularly, to such memories of the conductor-access type.

BACKGROUND OF THE INVENTION

Conductor access bubble memories are well known in the art. Such memories employing thin film conductors with apertures for moving bubbles are disclosed in U.S. Pat. Nos. 4,143,419 and 4,143,420, issued Mar. 6, 1979. My patent application Ser. No. 014,606, filed Feb. 23, 1979, now U.S. Pat. No. 4,187,555, discloses a major-minor magnetic bubble organization based on film type conductor access implementation with a transfer function shown for interpath transfer of bubble patterns.

A reduction of the power requirements for solid state devices in general and the conductor access major-minor memory in particular is a constant goal. Thus the specific problem herein is to reduce the power requirement of a conductor-access bubble memory.

BRIEF DESCRIPTION OF THE ILLUSTRATIVE EMBODIMENT

A major-minor, conductor access, bubble memory is realized herein by organizing each minor loop as a series of relatively small loop segments. Each set of corresponding segments of the minor loops is powered by a sector of the electrically-conducting films to which drive pulses are applied for moving bubbles in that set. Each set is separated from next adjacent sets of segments by a transfer implementation so that appropriately timed transfer operations cause movement of a bubble pattern from one set of corresponding segments to the next. Consequently, a plurality of propagation operation cycles plus interleaved transfer operations cause stored bubbles to move about the segments of the associated minor loops much as in traditional major-minor operation. On the other hand, only one set of conductor sectors need be powered at a time except when a transfer operation occurs. A "ripple" type of operation results. In one embodiment, when a transfer operation is to occur, adjacent sectors, between which transfer is to occur, are powered. No separate transfer implementation is required.

The organization permits a significant reduction of power requirements, by approximately the ratio of the area of the powered segments over the totality of the area occupied by the minor loops to be realized. To achieve the power reduction, the conductor films, to which the propagation pulses are applied, are themselves separated into sectors or strips so that power can be supplied selectively to move bubbles in the individual sets of minor loop segments.

DETAILED DESCRIPTION

Figure 1:
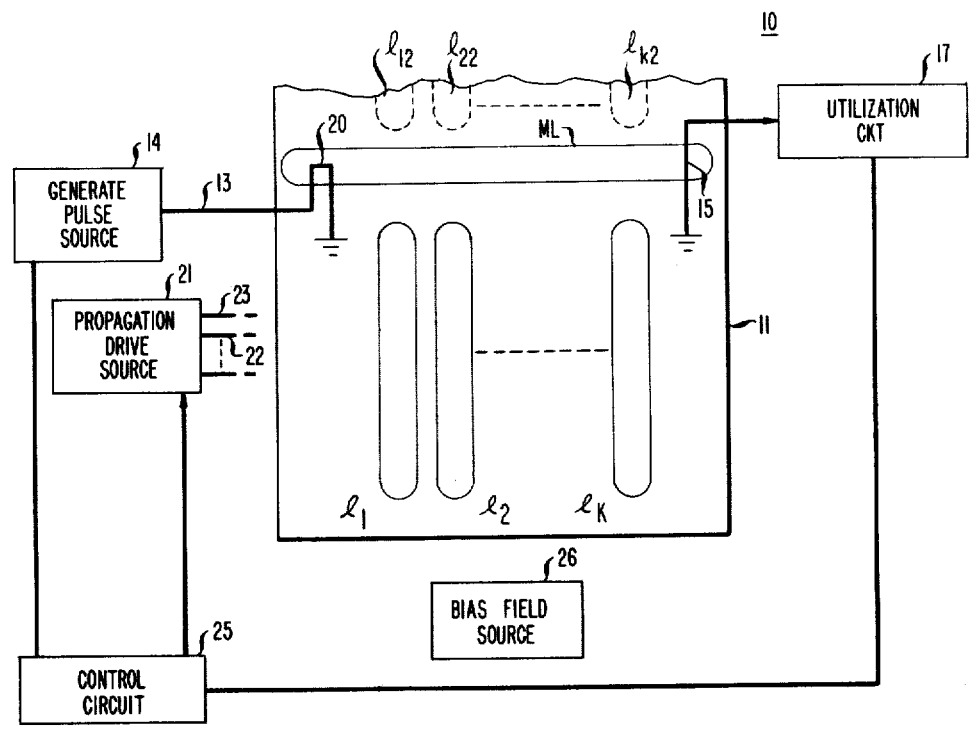
FIG. 1 is a schematic block diagram of a magnetic bubble memory in accordance with this invention.

FIG. 1 shows a magnetic bubble memory 10 including a host layer 11 in which magnetic bubbles can be moved. Bubble movement occurs along paths which are organized in the major-minor mode. Such an organization is characterized by a plurality of recirculating loops commonly termed "minor loops" $l_1 \ldots l_k$ for "permanent" storage of bubbles and a single channel which is either a path or a loop for accessing. The single (channel or) loop is called the major (path or) loop and is designated ML in the figure.

The major loop is operative to move bubble patterns to and from the minor loops selectively. Also, the loop is operative to substitute new bubble patterns for old patterns stored in the minor loops and to move bubble patterns to a detector. To this end, a bubble generator and a bubble detector are coupled to the major loop. The bubble generator includes an electrical conductor 13 shown connected between a generate pulse source 14 and ground. The detector includes a magnetoresistive element 15 shown connected between a utilization circuit 17 and ground.

Bubbles generated at 20 by pulses in conductor 13 generate a pattern of bubbles in loop ML for movement. A propagation drive source 21 pulses conductors 22 and 23 in a manner to move bubbles in layer 11 as is discussed more fully hereinafter. Those drive pulses move bubbles to positions from which the bubbles can be moved into a selected address in minor loops $l_1 \ldots l_k$. For movement of a newly generated pattern of bubbles into the minor loops, the selected address is cleared of data to receive that new pattern. To achieve the requisite clearing of data and storing of new data, transfer-out and transfer-in operations are conducted at transfer positions in the minor loops at which those loops come into close proximity with associated stages of the major loop. A suitable conductor-access transfer is disclosed in my above-mentioned copending application.

Stored data transferred out of a selected address in the minor loops moves along the major loop to detector 15 for applying to utilization circuit 17 signals indicative of the transferred data. Once detected, that data can be annihilated by, for example, annihilate pulses on conductor 13, or returned to the minor loops by a later transfer-in operation if no new data is generated.

The various operations of the memory are synchronized with respect to the drive pulses from source 21 by a control circuit 25. The various sources and circuits may be any such elements capable of operating in accordance with this invention.

Bubbles in layer 11 are maintained at a nominal diameter by a bias field supplied by source 26.

Figure 2:
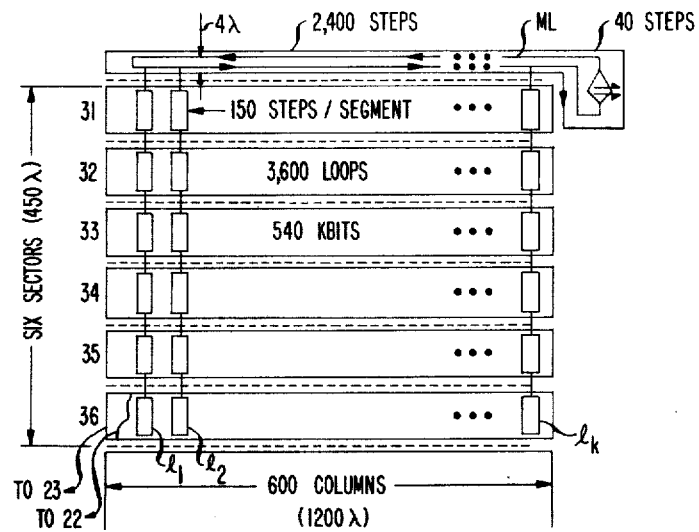
FIGS. 2 and 3 are schematic top views of an illustrative organization of the bubble chip for the memory of FIG. 1.

FIG. 2 shows the general organization of a bubble chip (layer 11) for a one-half million bit, dual-conductor, "ripple" chip in accordance with this invention. The minor loops $l_1 \ldots l_k$ are organized into sectors by independently driven pairs of conductor strips. Six sectors 31, 32, ... 36 are shown, a sector being defined by first and second electrically-conducting films separated by an insulating film (typically of silicon dioxide). The electricaly-conducting films also are apertured alike and offset with respect to one another to provide, when pulsed, the minor loop segments in which bubble movement occurs. Bubbles are moved in all the segments of the minor loops which correspond to a pulsed sector.

Conductors such as 22 and 23 of FIG. 1 are shown only for sector 36 in FIG. 2.

Each minor loop segment, driven by pulses applied to conductors of one sector herein, comprises one hundred and fifty steps. Each minor loop comprises segments associated with six sectors. This leads to the equivalent of nine hundred steps per minor loop. For a (nominally) one-half megabit chip, thirty six hundred minor loop segments are defined (leading to five hundred and forty thousand bits). The overall dimensions of the area occupied by the minor loops is 450λ × 1200λ where λ equals the period of the aperture pattern in the conductor films. At present λ equals 8 microns.

Figure 3:
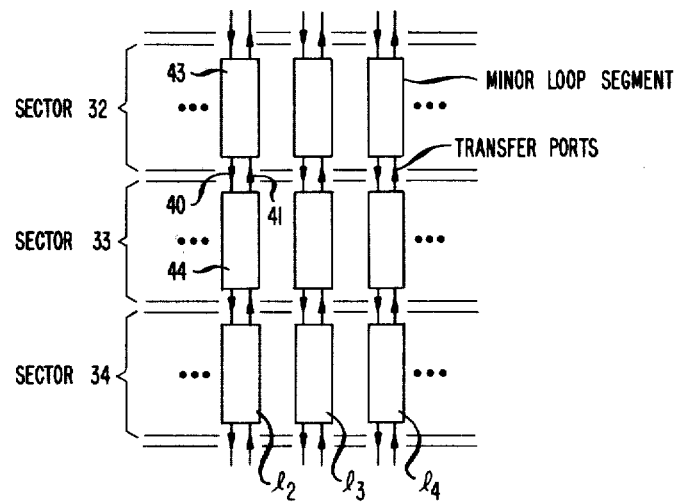

FIG. 3 shows minor loop segments with transfer ports in between. Specifically, FIG. 3 shows several minor loop segments and associated conductor sectors of, for example, minor loops $l_2$, $l_3$ and $l_4$. A pair of oppositely directed arrows is shown between each sector as, for example, arrows 40 and 41 between minor loop segments 43 and 44. The arrows indicate the direction in which transfer occurs illustratively, for bubble patterns moving counterclockwise in the minor loops segment. A minor loop segment thus can be seen to operate to move bubbles on the average of 75 steps by pulsing the conductors of one sector before a transfer operation occurs. Thereafter, the next adjacent sector conductors are pulsed similarly. During a transfer, the conductors of both of a pair of adjacent sectors are used.

Figure 4:
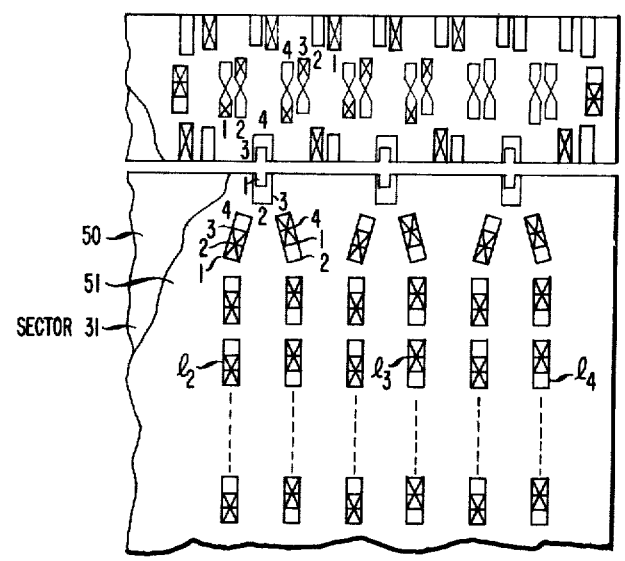
FIGS. 4 and 5 are enlarged top views of portions of the memory of FIG. 1.

My above-mentioned copending application, shows such a transfer between a plurality of minor loops and a major loop. Such a transfer and segmented conductor film arrangement as shown therein is extended to achieve a segmented minor loop organization herein. FIG. 4 shows the aperture pattern for sector 31 and for the major loop and the minor loops as well as the transfer arrangement therebetween. The two conductor films for sector 31 are designated 50 and 51. The apertures are shown as rectangles with each rectangle associated with the lower film 50 having an x on it. Note that the patterns on the two layers are very much alike and offset from one another.

Figure 5:
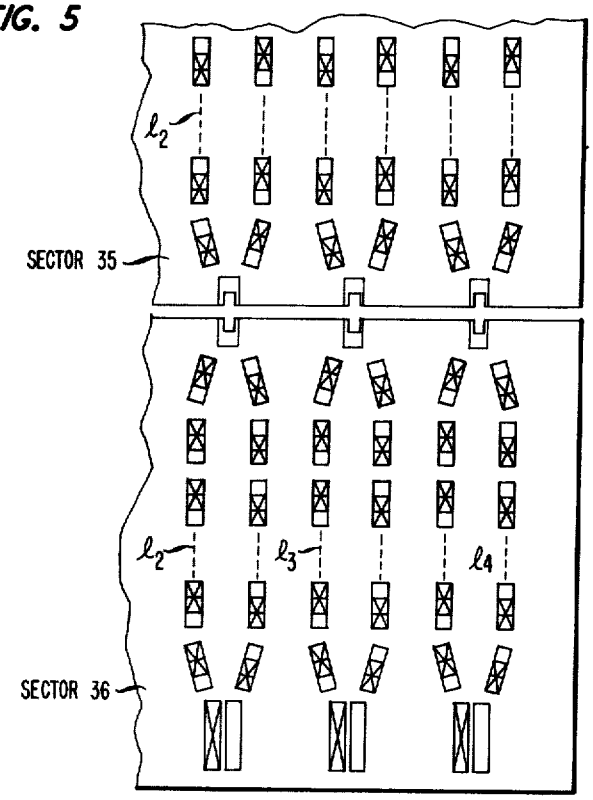

FIG. 5 shows sectors 35 and 36 with aperture patterns defining segments of loops $l_2$, $l_3$ and $l_4$ with conventional 180 degree turns at the lower end of each loop of sector 36 as viewed. Three pairs of apertures are shown at the juncture between sector 35 and sector 36, one pair for each pair of segments of a minor loop. The strategy for driving the conductor sectors for achieving recirculation of bubbles in the minor loops is to apply drive pulses to a selected sector for moving bubbles in the associated set of segments, to transfer the bubbles at a selected address to the next adjacent set of segments, then to drive that next sector for moving bubbles in the set of segments associated therewith.

Figure 6:
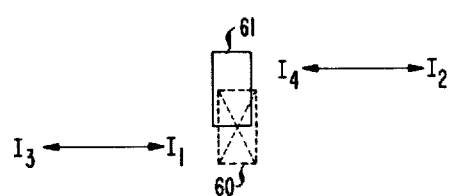
FIG. 6 is a schematic diagram of the drive pulses for the movement of bubbles in the memory of FIGS. 1-5.

FIG. 6 shows representation 60 and 61 of rectangular apertures in films 50 and 51, respectively, of FIG. 4. Current pulses $I_1$ and $I_3$ and $I_2$ and $I_4$ are applied to film 50 and 51, respectively, as indicated in FIG. 4. Normal bubble propagation proceeds clockwise through the consecutive positions designated in FIG. 4 to correspond to the subscripts for the current indication (I) in FIG. 6. The sequence for moving from a minor loop segment associated with sector N to one associated with a sector N-1 is [1234 ... 1234 1234 1214] for the drive pulses in sector N where the sequence 1214 is the transfer-in sequence. Sector N-1 is driven simultaneously [1214 1234 1234 1234] where again the sequence 1214 is the transfer-in sequence and is applied snychronously to the two sectors. On the other hand, to go from segments associated with an N sector to segments associated with an N+1 sector, the transfer sequence is 3432. Each segment when loaded with data is left with at least one stage vacant in order to allow movement of data in a segment in a manner to position a vacancy to receive transferred data.

The movement of data between segments is the same as the movement between minor loops and the major loop as described in my above-mentioned copending application. What is significant herein is that minor loops themselves are organized in segments with transfer operations occurring to move data from segment to segment. In this manner only a very small portion of the memory need be operated at any one time. The advantages are clear from the following tabulation of the parameter, specifications and power analysis for the illustrative one-half megabit bubble chip.

| DUAL-CONDUCTOR 500 KBIT RIPPLE CHIP DESIGN | |
|---|---|
| PARAMETERS: | |
| Circuit period | 8 μm |
| Shifting rate | 1 MHz |
| Current density for shifting | 1.5 mA/μm |
| Current density for detector | 4.5 mA/μm |
| SPECIFICATION: | |
| Total bits | 540,000 |
| Useful bits | 504,000 |
| Loops | 3,600 |
| Loops per sector | 600 |
| Average access time | 845 μsec |
| Average cycle time | 1.45 msec |
| Data rate | 500 KHz |
| Average chip power | 316 mW |
| Peak current per sector | 900 mA |
| Chip dimensions | 200 mils × 500 mils |

| DUAL-CONDUCTOR 500 KBIT RIPPLE CHIP POWER ANALYSIS | | | | | |
|---|---|---|---|---|---|
| | Cont Power (MW) | Average Case | | Worst Case | |
| | | Duty Factor | Power | Duty Factor | Power |
| Sector[1] | 1,300 | 0.08 | 100 | 0.18 | 230 |
| Major[2] | 70 | 0.92 | 64 | 0.82 | 57 |
| Detector[3] | 165 | 0.92 | 152 | 0.82 | 135 |
| | | | 316 | | 422 |

[1]Sector is 75λ by 1200λ
[2]Major is 4λ by 1200λ
[3]Detector is 50λ by 25λ

A considerable savings in power is achieved, because, as can be seen, total chip power is reduced from about 8 watts to less than one-half watt. This is commensurate with power requirements for a typical field access bubble memory operating at about 100 kilohertz.

As mentioned in my above-mentioned copending application, the location of a major loop in the center of a chip with sets of minor loops to either side improves access time. Here too, access time of a segmented memory is improved with the major loop so located. FIG. 1 indicates a second set of minor loops by the broken half ellipsis $l_{12}$, $l_{22}$ . . . $l_{k2}$. Similarly, a plurality of major loops interspersed between sectors also allows for still further improved access times.

The potential for such a memory to function as a cache memory is apparent. Such a memory is one where more frequently used data is reordered in memory to positions which are relatively more accessible. One such memory is disclosed in P. I. Bonyhard-T. J. Nelson, U.S. Pat. No. 3,701,132, issued Oct. 24, 1972. Particularly in this connection, the minor loop segments may include different numbers of steps, the minor loops may include different numbers of segments, and the sectors themselves may have different widths allowing different dimensions for the apertures of the segments.

It should be clear, at this juncture, that bubble transfer between minor loop segments or to or from the major loop could be implemented with a separate transfer pulse source (not shown).

What has been described is considered merely illustrative of the principles of this invention. Accordingly, those skilled in the art can devise modifications thereof in accordance with those principles yet within the spirit and scope of the invention as encompassed by the following claims.

I claim:

1. A magnetic bubble memory comprising a host layer of material in which magnetic bubbles can be moved synchronously about a plurality of minor loops, each of said minor loops comprising a set of segments in which bubbles can be moved selectively, said memory being characterized by means, coupled separately to corresponding segments of said minor loops and being separately energizable for moving bubbles selectively in the corresponding segments of said sets.

2. A magnetic bubble memory, in accordance with claim 1, said memory also including a major path and means for selectively moving bubbles between transfer positions in said minor loops and associated stages of said major path.

3. A magnetic bubble memory in accordance with claim 2 including means for selectively moving bubbles between selected pairs of adjacent segments of said minor loops.

4. A magnetic bubble memory in accordance with claim 2 wherein said major path is disposed centrally with respect to said layer and said memory includes first and second pluralities of minor loops to first and second sides of said major path respectively.

5. A magnetic bubble memory in accordance with claim 2 wherein all of said sectors include a like number of stages.

6. A magnetic bubble memory comprising a host layer of material in which magnetic bubbles can be moved synchronously about a plurality of minor loops, each of said minor loops comprising a set of segments in which bubbles can be moved selectively, said memory being characterized by means, coupled separately to corresponding segments of said minor loops and being separately energizable for moving bubbles selectively in the corresponding segments of said sets wherein said means for moving includes first and second electrically-conducting films coupled to said host layer, said films being separated into a plurality of sectors, the films in each of said sectors being apertured in a manner to move bubbles in a plurality of minor loop segments therein in response to pulses applied to the films of one of said sectors.

* * * * *